United States Patent [19]
Yuzuriha et al.

[11] Patent Number: 6,011,293
[45] Date of Patent: Jan. 4, 2000

[54] SEMICONDUCTOR DEVICE HAVING A STRUCTURE FOR DETECTING A BOOSTED POTENTIAL

[75] Inventors: Kojiro Yuzuriha; Makoto Ooi; Shinichi Kobayashi, all of Tokyo, Japan

[73] Assignee: Mitsubishi Denki Kabushiki Kaisha, Tokyo, Japan

[21] Appl. No.: 09/064,835

[22] Filed: Apr. 23, 1998

[30] Foreign Application Priority Data

Oct. 16, 1997 [JP] Japan ................................. 9-283635

[51] Int. Cl.[7] .................... H01L 29/788; H01L 29/76; H01L 29/94; H01L 31/062
[52] U.S. Cl. .................... 257/380; 257/316; 257/379; 257/537; 257/538; 257/754
[58] Field of Search ..................... 257/316, 379, 257/380, 381, 538, 754, 536, 537

[56] References Cited

U.S. PATENT DOCUMENTS

| | | | |
|---|---|---|---|
| 5,751,050 | 5/1998 | Ishikawa et al. | 257/538 |
| 5,801,418 | 9/1998 | Ranjan | 257/336 |
| 5,874,770 | 2/1999 | Saia et al. | 257/536 |
| 5,903,033 | 5/1999 | Shaw | 257/358 |

FOREIGN PATENT DOCUMENTS 3-83361  4/1991  Japan .

*Primary Examiner*—Ngân V. Ngô
*Attorney, Agent, or Firm*—McDermott, Will & Emery

[57] ABSTRACT

A p-type well and an n-type well surrounding the p-type well are formed in a p-type semiconductor substrate under a field insulating film. A polysilicon resistance film is formed on the field insulating film simultaneously with a floating gate formed in a memory cell region. A polycide conductive film is formed on a interlayer insulating film simultaneously with an auxiliary bit line formed in the memory cell region, and the polycide conductive film is connected to the resistance film by a contact formed in a via hole. A wiring line formed on an interlayer insulating film is connected to the polycide conductive film by a contact formed in a via hole penetrating the interlayer insulating film. The two via holes are formed at positions corresponding to regions in the p-type well. A negative voltage is applied to the wiring line, and the potential of a predetermined point on the resistance film is measured.

12 Claims, 6 Drawing Sheets

SEMICONDUCTOR DEVICE HAVING A STRUCTURE FOR DETECTING A BOOSTED POTENTIAL

BACKGROUND OF THE INVENTION

1. Field of the Invention

The present invention relates to a semiconductor device with an internal booster and a structure for detecting a boosted potential, and more specifically, to improvements in a connecting structure for connecting a negative potential to a resistor film in a raised potential measuring circuit in a semiconductor device.

2. Background Art

In a semiconductor memory device, such as an EEPROM, requiring a high voltage for writing and erasing data from memory cells, a positive or negative supply voltage must be raised and the raised voltage must be measured to see whether or not the supply voltage has been raised to a desired voltage.

FIG. 4 is a block diagram showing a raised potential measuring circuit. A voltage generated by a booster I or a booster II is connected to a resistance film 35, and potential at a predetermined point in the resistance film 35 is monitored to see whether or not the output voltage of booster I or booster II is appropriate.

A 16 Mb DINOR type flash memory employs a boosting and potential measuring configuration as shown in FIG. 4, because 10 V and −8 V must be generated from a supply voltage of 3.3 V generated by an external power supply.

DINOR is an acronym for "divided bit-line NOR type". Details of the configuration of the DINOR type flash memory are found in, for example, "A NOVEL CELL STRUCTURE SUITABLE FOR A 3 VOLT OPERATION, SECTOR ERASE FLASH MEMORY", 1992 IEDM TECHNICAL DIGEST, pp. 599–602 or "A 3.3 V-Only 16 Mb DINOR Flash Memory", 1995 ISSCC DIGEST OF TECHNICAL PAPERS.

Techniques relating to DINOR flash memories are disclosed also in "3.3 V Single Power Supply", Mitsubishi Denki Giho, Vol. 69, No. 3, pp. 47–50 (1995) and "Realization of low-voltage Reloading by F-N Injection, Achievement of both Cost Reduction and Functional Enhancement", NIKKEI MICRODEVICES, pp. 64–68, January, 1993. The DINOR flash memories disclosed in the foregoing papers are characterized by a hierarchical structure provided with bit lines divided into main bit lines and auxiliary bit lines (or sub bit lines).

The raised potential measuring circuit shown in FIG. 4 consumes a large amount of power if a large current flows through the resistance film 35. Flow of a large current through the raised potential measuring circuit indicates current leakage in the booster and, if current leaks from the booster, the booster cannot raise the input voltage to a desired voltage. Therefore, the resistance film 35 must have a high resistance.

Since the material forming the control gate in a DINOR cell is usually also used for forming its associated word line, this material is typically a metal polycide having a high melting point; for example, a tungsten silicide (WSix) film of 100 nm in thickness. A doped polysilicon film of 100 nm in thickness has a very low sheet resistivity of 12 $\Omega/\square$.

FIG. 5 depicts an essential portion of a conventional DINOR type flash memory provided with the raised potential measuring circuit shown in FIG. 4. In FIG. 5, a memory cell region is shown in the right-hand section, and a peripheral circuit region is shown in the left-hand section.

The memory cell region shown in the right-hand section of FIG. 5 will now be described. A p-type well 3 and an n-type well 4 surrounding the p-type well 3 are formed in a region demarcated by an isolating oxide film 2 in the p-type semiconductor substrate 1. A memory cell formed on the surface of the p-type well 3 has a source 5, a drain 6, and a multilayer structure formed in a region between the source 5 and the drain 6 by laminating a tunnel oxide film 7, a floating gate 8, an insulating film 9 and a control gate 10 in that order.

A sub bit line 14 is formed in an interlayer insulating oxide film and is connected to a main bit line, not shown. The floating gate 8 is formed of polysilicon, and the control gate 10 is a two-layer construction formed by depositing a tungsten silicide layer on a polysilicon layer.

The sub bit line 14 is connected to the drain 6 to apply a bit line voltage to the drain 6. A source voltage is applied to the source 7. A control voltage is applied to the control gate 10. A negative voltage or a ground voltage is applied to the p-type well 3. These voltages are used for programming the memory cell, writing data to, erasing data from or reading data from the memory cell.

The peripheral circuit region shown in the left-hand section of FIG. 5 will now be described. A peripheral circuit and a raised voltage measuring circuit are formed in the peripheral circuit region.

The peripheral circuit comprises a plurality of transistors. As shown in FIG. 5, each transistor has a source 21 and a drain 22 formed in a region of the surface of a p-type semiconductor substrate 1 isolated by the isolating oxide film 2. A two-layer structure of a gate insulating oxide film 23 and a gate electrode 24 is formed between the source 21 and the drain 22.

The raised voltage measuring circuit in the peripheral circuit region has a resistance film 35 formed on the isolating oxide film 2, an insulating film 36 (interlayer insulating film) formed on the resistance film 35, and a wiring line 39 formed on the insulating film 36. The wiring line 39 is connected to the resistance film 35 by a contact 42 penetrating the insulating film 36. A booster I is connected to the wiring line 39 to apply a raised voltage to one end of the resistance film 35. A booster II is connected to the other end of the resistance film 35 to apply another voltage to the other end of the resistance film 35. The potential of a predetermined point in an intermediate portion of the resistance film 35 is measured.

The resistance film 35, similarly to the floating gate formed in the memory cell region, is a polysilicon film. The potential measuring circuit illustrated in FIG. 4 is thus formed on the semiconductor substrate 1.

If the resistance film 35 of the raised voltage measuring circuit is formed, for example, of the same material as that of the floating gate 8 of the memory cell region, penetration indicated at 43 in FIG. 6 occurs in the resistance film 35 when forming a via hole for interconnecting a metal wiring line. This is because the floating gate 8 is a thin film of a thickness on the order of 100 nm. Such penetration 43 forms an unnecessary high resistance portion or an unnecessary current path, so that the desired voltage raising operation cannot be achieved.

SUMMARY OF THE INVENTION

The present invention addresses and solves this problem in the conventional art, and it is therefore an object of the present invention to provide an improved wiring structure to apply a raised voltage to a resistance film for raised voltage measurement. Another object of the present invention is to provide a potential measuring circuit employing an improved wiring structure, and a semiconductor device provided with such a potential measuring circuit.

According to one aspect of the present invention, a semiconductor device comprises a p-type semiconductor substrate, a p-type well formed in a surface of said p-type semiconductor substrate, and an n-type well formed so as to cover the bottom surface and the side surface of said p-type well. A surface insulating film is formed on the surface of said semiconductor substrate including said p-type well and said n-type well. A resistance film is formed on said surface insulating film so that at least a portion thereof lies over said p-type well. A first insulating film is formed on said the surface insulating film so as to cover said resistance film. A conductive film is formed on said first insulating film so that at least a portion thereof lies over said resistance film. A second insulating film is formed on said first insulating film so as to cover said conductive film. A wiring line is formed on said second insulating film so that at least a portion thereof lies over said conductive film. A first contact is formed to penetrate said first insulating film to connect one end of said resistance film to said conductive film. A second contact is formed to penetrate said second insulating film to connect said conductive film to said wiring line. Further, said p-type well extends outward by a predetermined length from the extension lines toward the p-type well of said first and the second contacts respectively.

In another aspect of the present invention, the semiconductor device further comprises a memory cell region. Said memory cell region includes a plurality of memory cells each comprised of a floating gate transistor, and further includes auxiliary bit lines of a divided bit line structure. Further, said resistance film is formed simultaneously with said floating gates of said memory cell region, and said conductive film is formed simultaneously with said auxiliary bit lines of said memory cell region.

In another aspect of the present invention, said resistance film is formed of a polysilicon layer, said conductive film is formed in a two-layer film consisting of a polysilicon layer and a tungsten silicide layer, and said wiring line is formed of an aluminum layer.

In another aspect of the present invention, a potential of said resistance film is measured at a predetermined position between the opposite ends of said resistance film, while a generated negative voltage is applied to said wiring line which is electrically connected to one end of said resistance film, and another generated voltage is applied to the other end of said resistance film.

In another aspect of the present invention, a potential of said resistance film is measured at a predetermined position between the opposite ends of said resistance film, while a generated negative voltage is applied to said wiring line which is electrically connected to one end of said resistance film, and another generated voltage is applied to the other end of said resistance film.

In another aspect of the present invention, the potential of said resistance film is measured while said p-type well is set at a floating potential, said n-type well is set at a supply potential, and said p-type semiconductor substrate is set at a ground potential.

Other and further objects, features and advantages of the invention will appear more fully from the following description.

DESCRIPTION OF THE INVENTION

This invention will be described in further detail by way of examples with reference to the accompanying drawings.
First Embodiment A wiring structure for a raised potential measuring circuit according to a first embodiment of the present invention and a semiconductor device having the inventive raised potential measuring circuit will now be described with reference to the accompanying drawings. By way of example, a raised potential measuring circuit included in a DINOR type flash memory will be explained.

Figure 1:
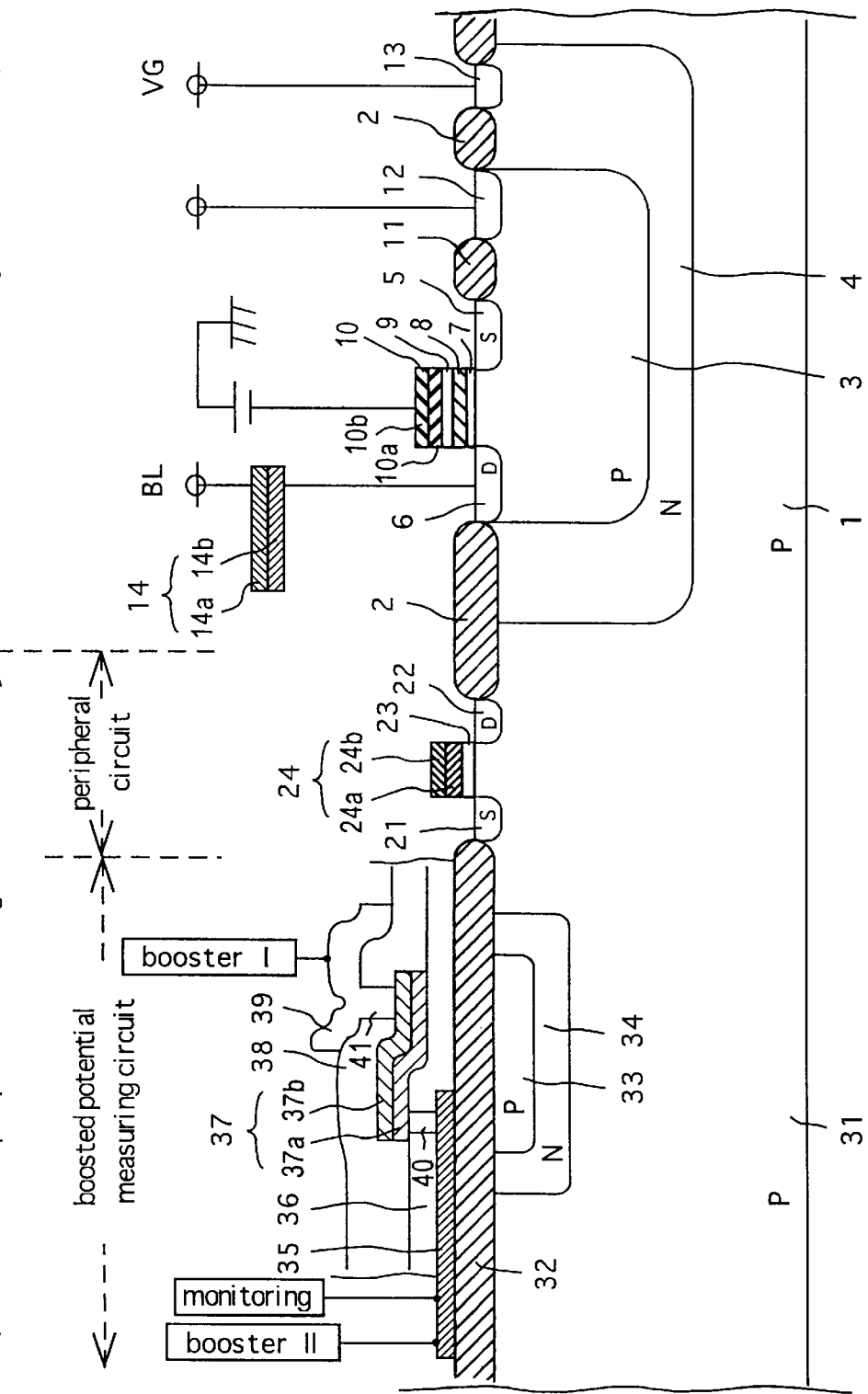
FIG. 1 is a cross-sectional view of a DINOR flash memory provided with a raised potential measuring circuit according to the present invention.

A memory cell region and a peripheral circuit region are shown in a right-hand section and a left-hand section, respectively, of FIG. 1.

First, the memory cell region in the right-hand section will be described. FIG. 1 depicts a p-type semiconductor substrate 1 of silicon or the like, an isolating oxide film 2 formed on a surface of the semiconductor substrate 1, a p-type well 3 formed in a predetermined region of the surface of the p-type semiconductor substrate 1, and an n-type well 4 formed in the p-type semiconductor substrate 1 so as to cover the bottom surface and the side surface of the p-type well 3.

FIG. 1 also shows a source 5 for a memory cell, formed in the surface of the p-type well 3, a drain 6 of the memory cell, a tunnel oxide film 7 formed on a region of the p-type semiconductor substrate 1 between the source 5 and the drain 6, a polysilicon floating gate 8, an insulating film 9, a control gate 10 in a two-layer structure constructed by forming a tungsten silicide film 10b on a polysilicon film 10a, an oxide film 11, a contact region 12 formed in the p-type well 3, and a contact region 13 formed in the n-type well 4.

An auxiliary bit line or sub bit line 14 is formed in an interlayer insulating film. The auxiliary bit line 14 is a two-layer structure constructed by forming a tungsten silicide film 14b on a polysilicon film 14a. The auxiliary bit line 14 is connected to the drain 6 to apply a bit line voltage to the drain 6. A source voltage is applied to the source 5. A control voltage is applied to the control gage 10. A negative voltage or a ground voltage is applied through the contact region 12 to the p-type well 3. A supply voltage is applied through the contact region 13 to the n-type well 4. Those voltages are used for programming the memory cell, writing data to, erasing data from or reading data from the memory cell.

The peripheral circuit region shown in the left-hand section of FIG. 1 will now be described. A peripheral circuit and a boosted potential (or raised potential) measuring circuit are formed in the peripheral circuit region.

The peripheral circuit has a plurality of component transistors formed in a region in a surface of the p-type semiconductor substrate 1 demarcated by an isolating oxide film 2. One of the transistors is shown in FIG. 1. The transistor has a source 21, a drain 22, a gate insulating film 23, and a gate electrode 24. The gate electrode 24 is a two-layer structure constructed by forming a tungsten silicide film 24b on a polysilicon film 24a.

The raised potential measuring circuit formed in the peripheral circuit region has a p-type semiconductor substrate 31 of silicon or the like, a p-type well 33 formed in a predetermined region on a surface of the p-type semiconductor substrate 31, an n-type well 34 formed in the p-type semiconductor substrate 31 so as to cover the bottom surface and the side surface of the p-type well 33, and a surface insulating film 32 formed over the surface of the p-type semiconductor substrate 31 provided with the p-type well 33 and the n-type well 34.

A polysilicon resistance film 35 is formed on the surface insulating film 32 so that at least a portion thereof lies over the p-type well 33, so as to overlap the p-type well 33.

A first insulating film 36 of silicon oxide or the like is formed on the surface insulating film 32 so as to cover the resistance film 35. A conductive film 37 is formed on the first insulating film 36 so that at least a portion thereof lies over the resistance film 35, i.e., so as to overlap the resistance film 35. The conductive film 37 is a two-layer structure constructed by forming a tungsten silicide film 37b on a polysilicon film 37a.

A second insulating film 38 of a silicon oxide film or the like is formed on the first insulating film 36 so as to overlap the conductive film 37. A wiring line 39 of aluminum or the like is formed on the second insulating film 38 so that at least a portion thereof lies over the conductive film 37, i.e., so as to overlap the conductive film 37.

A first contact 40 penetrates the first insulating film 36 to connect one end of the resistance film 35 to the conductive film 37. A second contact 41 penetrates the second insulating film 38 to connect the conductive film 37 to the wiring line 39.

The p-type well 33 extends outward by a predetermined length passing an extension line from the first contact 40. The p-type well 33 extends outward by a predetermined length passing an extension line from the second contact 41.

Figure 4:
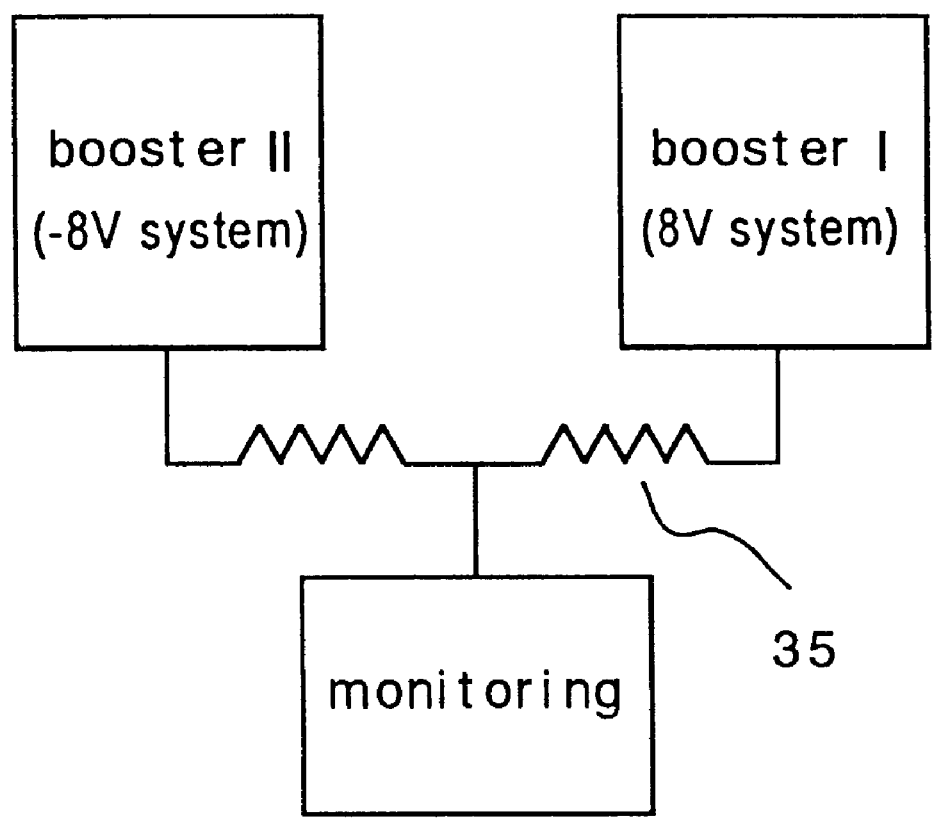
FIG. 4 is a block diagram of a raised potential measuring circuit.
Figure 5:
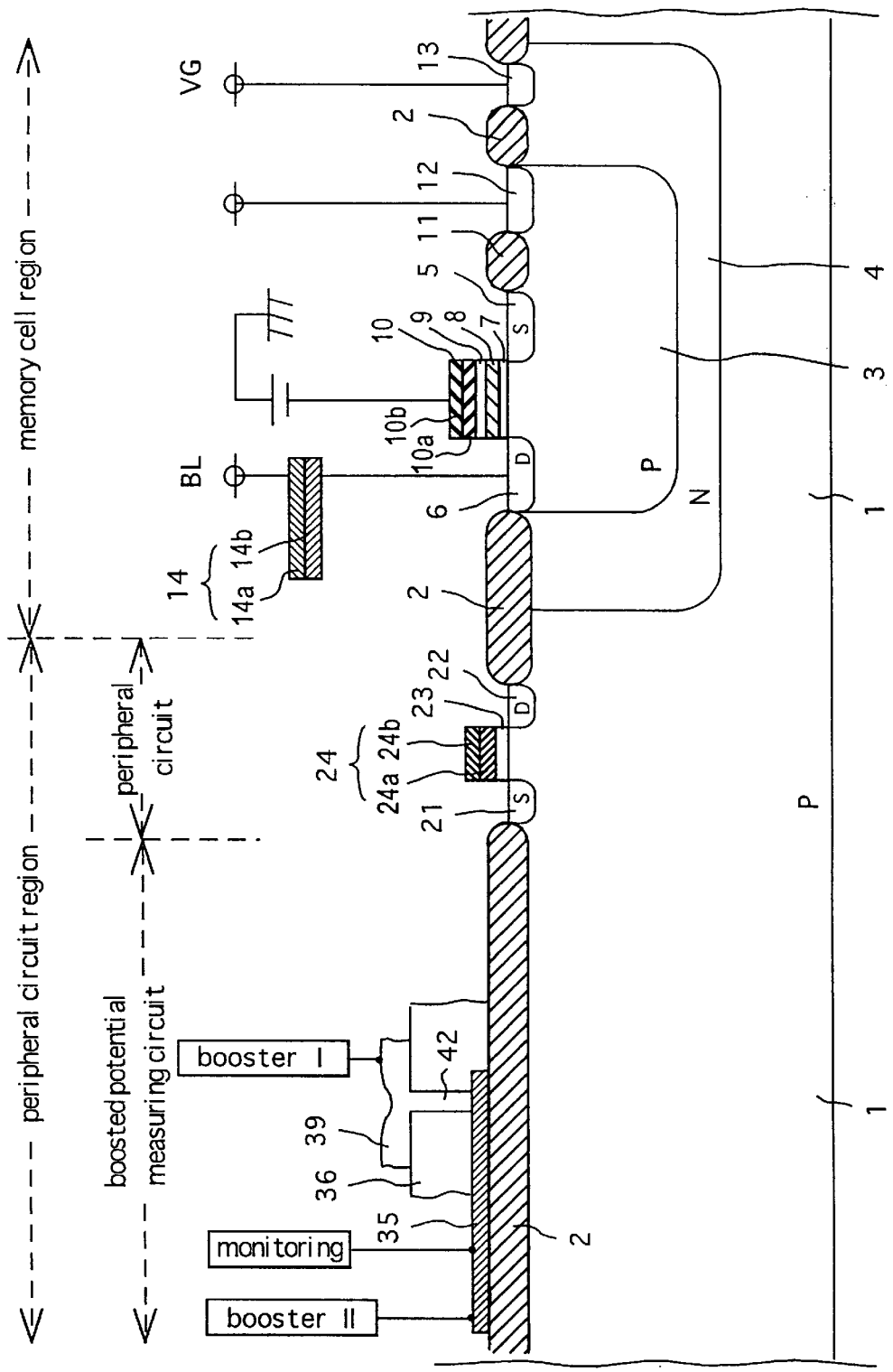
FIG. 5 is a cross-sectional view of a conventional DINOR type flash memory provided with the raised potential measuring circuit shown in FIG. 4.
Figure 6:
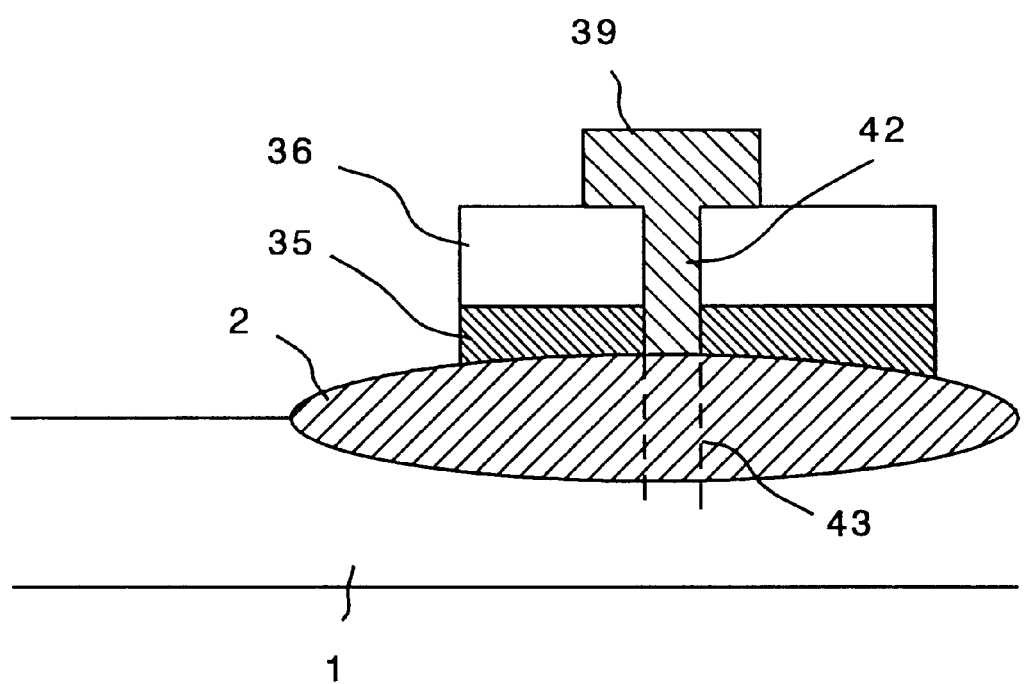
FIG. 6 is a cross-sectional view of an undesireable penetration of a via hole in a resistance film in a conventional DINOR flash memory.

The wiring line 39 is connected to a terminal of a negative potential of the booster I. The other end of the resistance film 35 is connected to a terminal of a positive potential of the booster II. A measuring point for measuring potential lies on the resistance film 35 at a position between the opposite ends of the resistance film 35. The potential measuring circuit previously described with reference to FIG. 4 is formed on the semiconductor substrate 31.

A method of fabricating this structure will be described hereinafter.

The raised potential measuring circuit and the memory cell region are formed on the same semiconductor substrate 31 and 1. The p-type well 33 and the n-type well 34 of the raised potential measuring circuit are formed simultaneously with the p-type well 3 and the n-type well 4 of the memory cell region, respectively. The resistance film 35 of the raised potential measuring circuit and the floating gate 8 of the memory cell region each of polysilicon are formed simultaneously. The two-layer conductive film 37 consisting of the polysilicon film and the tungsten silicide film of the raised potential measuring circuit and the two-layer auxiliary bit line 14 of the memory cell region consisting of the polysilicon film and the tungsten silicide film are formed simultaneously.

The resistance film 35 is formed of the same material as that of the floating gate 8, and the conductive film 37 is formed of the same material as that of the auxiliary bit line, i.e. of WSix layers. The resistance film 35 is connected to the conductive film 37 by the first contact 40 through a via hole (or a direct via hole) formed in the insulating film 36, and the conductive film 37 is connected to the aluminum wiring line 39 by the second contact 41 through a via hole formed in the insulating film 38. A negative voltage generated by the booster is applied to the aluminum wiring line 39.

Figure 2:
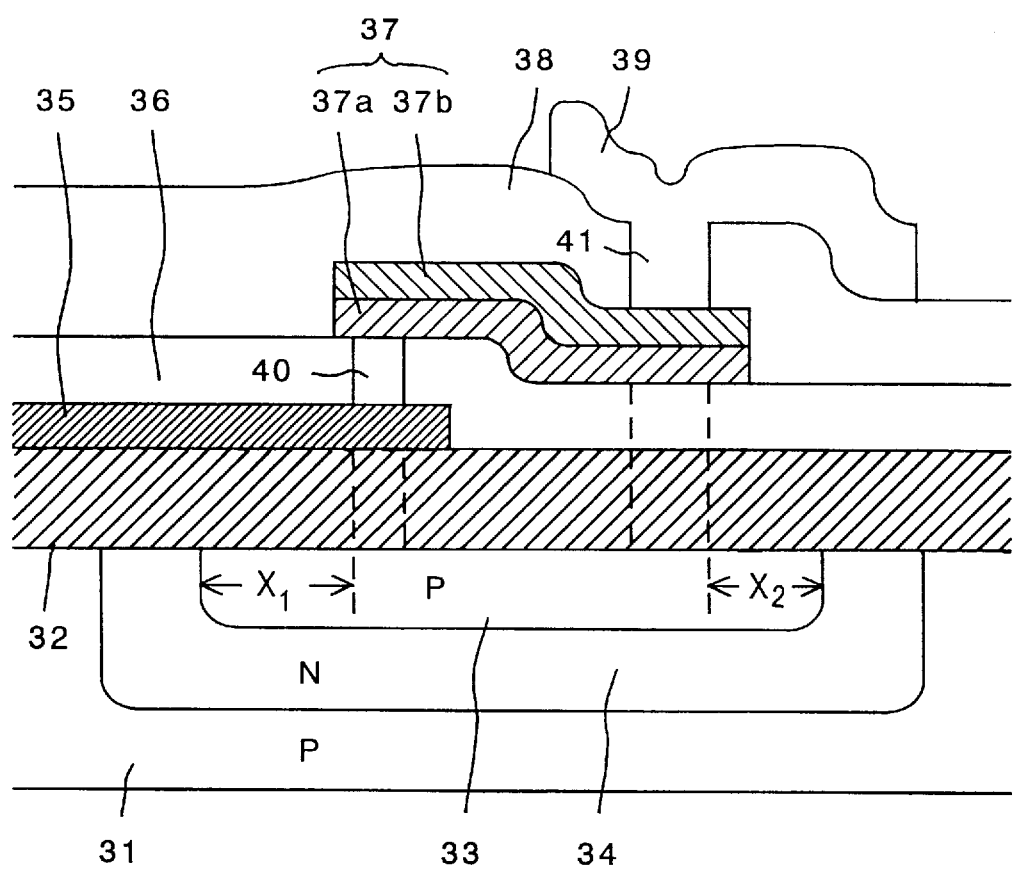
FIG. 2 is an enlarged view of the raised potential measuring circuit shown in FIG. 1.

FIG. 2 is an enlarged view of the raised potential measuring circuit shown in FIG. 1.

As shown in FIG. 2, the p-type well 33 is formed to prevent the flow of unnecessary current, even if the via hole (or the direct via hole) for the first contact 40 penetrates beyond the resistance film 35 into the the p-type well 33. For that purpose, the p-type well 33 is formed with a margin of, for example, 3 μm below the via hole (or the direct via hole) for the first contact 40. Further, the n-type well 34 is formed so as to surround the p-type well 33.

Similarly, the p-type well 33 is formed with a margin of, for example, 3 μm below the via hole for the second contact 41, to prevent the flow of unnecessary current even if the via hole for the second contact 41, passing through the conductive film 37 of WSix polycide and the first insulating film 36 (interlayer insulating film), penetrates the surface insulating film 32 (field oxide film) reaching the p-type well 33. As shown in FIG. 2, the p-type well 33 has a peripheral portion of a length X2 of 3 μm or above. Further, the n-type well 34 is formed so as to surround the p-type well 33.

In the practical use of this raised potential measuring circuit, the p-type well 33 is kept at a floating potential. A fixed supply voltage of, for example, 3.3 V is applied to the n-type well 34, and a ground voltage is applied to the semiconductor substrate 31. Therefore, unnecessary current will not flow, even if the via hole for the first contact 40 or the second contact 41 reaches the p-type well 33 and a negative voltage is applied to the p-type well 33. This is because the p-type well 33 forms an inverse junction with the n-type well 34.

As is apparent from the foregoing description, the upper wiring line 39 is connected to the lower resistance film 35 underlying the wiring line 39 through the two contacts formed in the two via holes instead of a single contact formed in a single via hole penetrating the interlayer insulating oxide film disposed between the wiring line 39 and the resistance film 35.

It is difficult to control the depth of a single via hole when forming a single via hole through the interlayer insulating oxide film, because the resistance film 35 is thin as compared with the interlayer insulating oxide film. Therefore, it may happen that the via hole penetrates the resistance film 35 and even the surface insulating film 32.

In this embodiment, the two via holes are formed on the opposite sides of the conductive film 37, respectively, to connect the wiring line 39 through the conductive film 37 to the resistance film 35. Therefore, the via hole penetrates the relatively thin interlayer insulating oxide film, and the depth of the via hole is easy to control. Thus, penetration of the via hole into the resistance film 35 can be reduced.

Even if the via hole penetrates the resistance film 35 and reaches the p-type well 33 to which a negative voltage is applied, no unnecessary current path is formed and no problem attributable to leakage current will arise, because the p-type well 33 forms an inverse junction with the n-type well 34. Thus, the inventive manufacturing process can absorb large variations from predetermined standards.

With regard to the structure of the DINOR flash memory and the method of fabricating the DINOR flash memory, the foregoing wiring structure is useful for application to a negative potential measuring circuit. The wiring structure of the raised potential measuring circuit can be constructed by utilizing the specific structure of the DINOR flash memory, that is, the structure of the n-type well surrounded by the p-type. The WSix polycide layer for the auxiliary bit line is also utilized. Therefore, the inventive wiring structure may be formed utilizing the processes for fabricating the DINOR flash memory without any additional steps.

Next, a method for forming a well structure employed in the DINOR flash memory will be described with reference to FIGS. 3(a) to 3(d).

The well structure employed in the DINOR flash memory is called a retrograde well. The n-type well 34 surrounding the p-type well 33 is formed by the following method.

Figure 3:
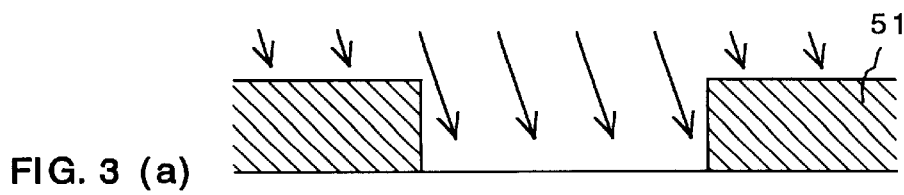
FIGS. 3(a) to 3(d) schematically illustrate sequential phases of a method for forming a well structure employed in the DINOR flash memory according to the present invention.
Figure 3:
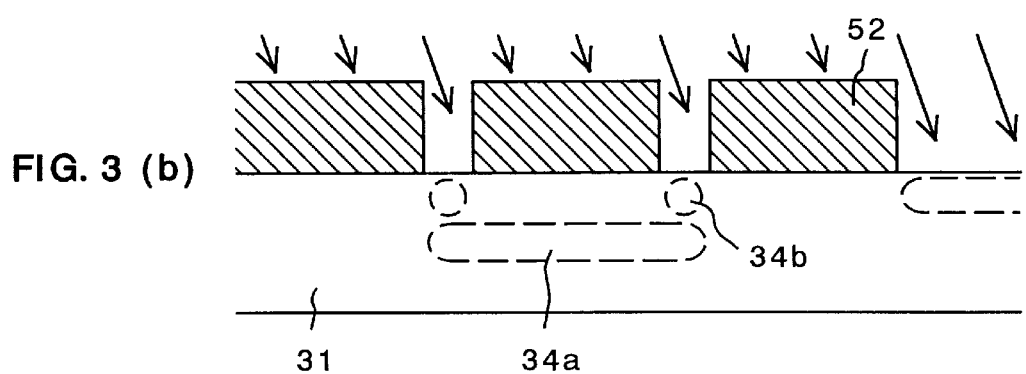
Figure 3:
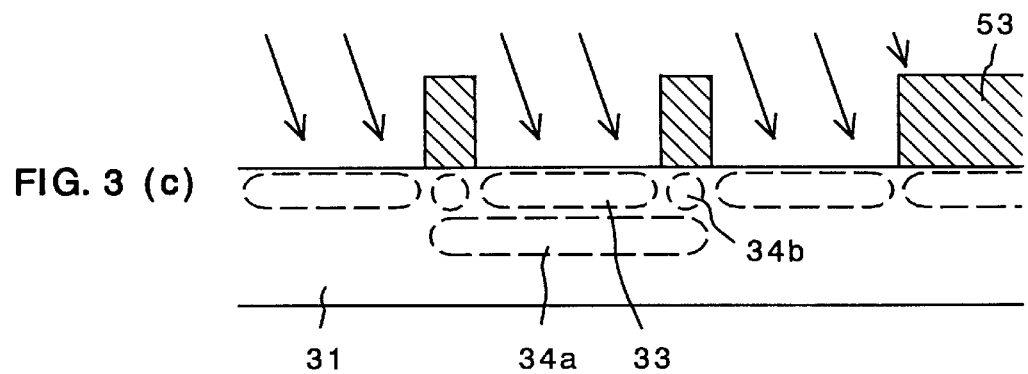
Figure 3:
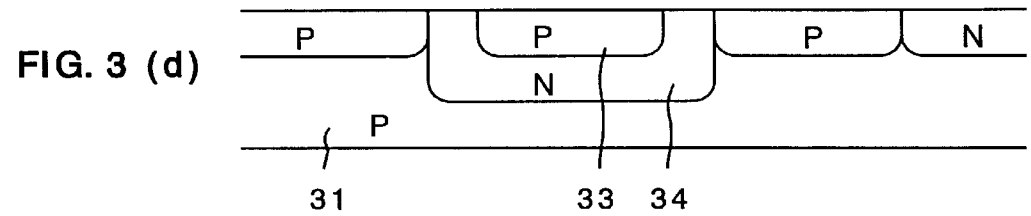

As shown in FIG. 3(a), a mask 51 of a photoresist film is formed on the surface of the p-type semiconductor substrate 31, and phosphorus ions are implanted in the surface of the p-type semiconductor substrate 31 at 2 MeV, for example, to form a bottom portion 34a of the n-type well 34 to surround the p-type well 33.

Then, as shown in FIG. 3(b), a mask 52 of a photoresist film is formed on the surface of the p-type semiconductor substrate 31, and phosphorus ions are implanted in the surface of the p-type semiconductor substrate 31 at 1 MeV, for example, to form side portions 34b of the n-type well 34 to surround the side surface of the p-type well 33. A potential of the n-type well 34 is applied to the side portions 34b of the n-type well 34 from above the semiconductor substrate 31.

As shown in FIG. 3(c), a mask 53 of a photoresist film is formed on the surface of the semiconductor substrate 31, and boron ions are implanted into the surface of the semiconductor substrate 31 by ion implantation at 600 keV, for example, to form the p-type well 33. Then, the semiconductor substrate 31 is subjected to a heat treatment process to complete a well structure as shown in FIG. 3(d).

The effects and advantages of the present invention are summarized as follows.

In the present invention, the via holes are provided in two steps to connect the upper wiring line and the lower wiring line to the resistance film underlying the wiring line. Therefore, the depth of the via hole is easy to control, and the possibility of the via hole penetrating the resistance film is reduced.

Even if the via hole penetrates the resistance film and reaches the p-type well to which a negative voltage is applied, no current path is formed and no problem relating to current leakage will arise, because the p-type well forms an inverse junction with the n-type well.

Further, the wiring structure for the inventive raised potential measuring circuit can be formed utilizing structure specific to the DINOR flash memory; that is, the p-type well surrounded by the n-type well, and the conductive film serving as the auxiliary bit line. Thus, the inventive wiring structure may be formed by utilizing the processes for fabricating the DINOR flash memory without requiring additional steps.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
   a p-type semiconductor substrate;
   a p-type well formed in a surface of said p-type semiconductor substrate;
   an n-type well covering the bottom surface and the side surface of said p-type well;
   a surface insulating film formed on the surface of said semiconductor substrate including said p-type well and said n-type well;
   a resistance film formed on said surface insulating film so that at least a portion thereof lies over said p-type well;
   a first insulating film formed on said surface insulating film so as to cover said resistance film;
   a conductive film formed on said first insulating film so that at least a portion thereof lies over said resistance film;
   a second insulating film formed on said first insulating film so as to cover said conductive film;
   a wiring line formed on said second insulating film so that at least a portion thereof lies over said conductive film;
   a first contact penetrating said first insulating film to connect one end of said resistance film to said conductive film; and
   a second contact penetrating said second insulating film to connect said conductive film to said wiring line;
   wherein said p-type well extends outward by a predetermined length from the extension lines toward the p-type well of said first and the second contacts respectively.

2. A semiconductor device according to claim 1, further comprising a memory cell region, said memory cell region including a plurality of memory cells each comprised of a floating gate transistor, said memory cell region further including auxiliary bit lines of a divided bit line structure, wherein said resistance film is formed simultaneously with said floating gates of said memory cell region, and said conductive film is formed simultaneously with said auxiliary bit lines of said memory cell region.

3. The semiconductor device according to claim 2, wherein said resistance film is a polysilicon layer, said conductive film is a two-layer film consisting of a polysilicon layer and a tungsten silicide layer, and said wiring line is an aluminum layer.

4. The semiconductor device according to claim 3, wherein a potential of said resistance film at a predetermined position between the opposite ends of said resistance film is measured while a generated negative voltage is applied to said wiring line which is electrically connected to one end of said resistance film, and another generated voltage is applied to the other end of said resistance film.

5. The semiconductor device according to claim 4, wherein said p-type well is set at a floating potential, said n-type well is set at a supply potential, and said p-type semiconductor substrate is set at a ground potential.

6. The semiconductor device according to claim 2, wherein a potential of said resistance film at a predetermined position between the opposite ends of said resistance film is measured while a generated negative voltage is applied to said wiring line which is electrically connected to one end of said resistance film, and another generated voltage is applied to the other end of said resistance film.

7. The semiconductor device according to claim 6, wherein said p-type well is set at a floating potential, said n-type well is set at a supply potential, and said p-type semiconductor substrate is set at a ground potential.

8. The semiconductor device according to claim 1, wherein said resistance film is a polysilicon layer, said conductive film is a two-layer film consisting of a polysilicon layer and a tungsten silicide layer, and said wiring line is an aluminum layer.

9. The semiconductor device according to claim 8, wherein a potential of said resistance film at a predetermined position between the opposite ends of said resistance film is measured while a generated negative voltage is applied to said wiring line which is electrically connected to one end of said resistance film, and another generated voltage is applied to the other end of said resistance film.

10. The semiconductor device according to claim 9, wherein said p-type well is set at a floating potential, said n-type well is set at a supply potential, and said p-type semiconductor substrate is set at a ground potential.

11. The semiconductor device according to claim 1, wherein a potential of said resistance film at a predetermined position between the opposite ends of said resistance film is measured while a generated negative voltage is applied to said wiring line which is electrically connected to one end of said resistance film, and another generated voltage is applied to the other end of said resistance film.

12. The semiconductor device according to claim 11, wherein said p-type well is set at a floating potential, said n-type well is set at a supply potential, and said p-type semiconductor substrate is set at a ground potential.

* * * * *